United States Patent
Waayers (10) Patent No.: US 7,941,719 B2
(45) Date of Patent: May 10, 2011

(54) IC TESTING METHODS AND APPARATUS

(75) Inventor: Tom Waayers, Sint Michielsgestel (NL)

(73) Assignee: NXP B.V., Eindhoven (NL)

( * ) Notice: Subject to any disclaimer, the term of this patent is extended or adjusted under 35 U.S.C. 154(b) by 337 days.

(21) Appl. No.: 12/090,971

(22) PCT Filed: Oct. 12, 2006

(86) PCT No.: PCT/IB2006/053756
§ 371 (c)(1),
(2), (4) Date: Apr. 21, 2008

(87) PCT Pub. No.: WO2007/049173
PCT Pub. Date: May 3, 2007

(65) Prior Publication Data
US 2008/0255780 A1     Oct. 16, 2008

(30) Foreign Application Priority Data

Oct. 24, 2005 (EP) .................................. 05109894

(51) Int. Cl.
*G01R 31/28* (2006.01)
(52) U.S. Cl. ......... 714/729; 714/727; 714/742; 714/724
(58) Field of Classification Search .................. 714/729, 714/727, 742, 724
See application file for complete search history.

(56) References Cited

U.S. PATENT DOCUMENTS

| | | | |
|---|---|---|---|
| 5,872,908 A * | 2/1999 | Whetsel | 714/30 |
| 6,611,934 B2 * | 8/2003 | Whetsel, Jr. | 714/727 |
| 6,643,810 B2 * | 11/2003 | Whetsel | 714/724 |
| 6,813,738 B2 * | 11/2004 | Whetsel, Jr. | 714/727 |

(Continued)

FOREIGN PATENT DOCUMENTS

JP          62-242873 A      10/1987

(Continued)

OTHER PUBLICATIONS

Fang et al., "Power-Constrained Embedded Memory BIST Architecture", 2003, IEEE International Symposium on Defect and Fault Tolerance in VLSI Systems, pp. 451-458.*

(Continued)

*Primary Examiner* — John J Tabone, Jr.

(57) ABSTRACT

A shift register circuit is provided for storing instruction data for the testing of an integrated circuit core. The shift register circuit comprises a plurality of stages, each stage comprising a serial input (si) and a serial output (so) and a parallel output (wir_output) comprising one terminal of a parallel output of the shift register circuit. A first shift register storage element (32) is for storing a signal received from the serial input (si) and providing it to the serial output (so) in a scan chain mode of operation. A second parallel register storage element (38) is for storing a signal from the first shift register storage element (32) and providing it to the parallel output (wir_output) in an update mode of operation. The stage further comprises a feedback path (40) for providing an inverted version of the parallel output (wir_output) to the first shift register storage element (32) in a test mode of operation.

This configuration enables testing of each shift register stage using the existing control lines. In particular, the inverted signal can be clocked to propagate through the shift register storage element and the parallel register storage element, and the eventual inversion of the output is monitored to indicate that the inverted signal has propagated through the circuitry.

15 Claims, 5 Drawing Sheets

U.S. PATENT DOCUMENTS

| | | | |
|---|---|---|---|
| 7,047,467 B1* | 5/2006 | Khu et al. | 714/727 |
| 7,401,277 B2* | 7/2008 | Yamada et al. | 714/726 |
| 7,409,612 B2* | 8/2008 | Van De Logt et al. | 714/727 |
| 7,506,231 B2* | 3/2009 | Chang et al. | 714/726 |
| 7,620,866 B2* | 11/2009 | Marinissen et al. | 714/727 |
| 2003/0101397 A1* | 5/2003 | Whetsel, Jr. | 714/726 |
| 2004/0199839 A1* | 10/2004 | Whetsel, Jr. | 714/726 |
| 2005/0204236 A1 | 9/2005 | Whetsel | |
| 2006/0156104 A1* | 7/2006 | Chang et al. | 714/724 |
| 2008/0034334 A1* | 2/2008 | Laouamri et al. | 716/4 |

FOREIGN PATENT DOCUMENTS

| | | | |
|---|---|---|---|
| JP | 2001-153928 A | 6/2001 | |
| WO | 2004070395 A2 | 8/2004 | |
| WO | 2007049171 A1 | 5/2007 | |
| WO | 2007049172 A1 | 5/2007 | |

OTHER PUBLICATIONS

DaSilva et al., "Overview of the IEEE PI500 Standard", 2003, ITC International Test Conference, pp. 988-997.*

Dervisoglu, "A Unified DFT Architecture for use with IEEE 1149.1 and VSI/IEEE P1500 Compliant Test Access Controllers", Jun. 18-22, 2001, DAC 2001, pp. 53-58.*

Li, et al., "A Hierarchical Test Scheme for System-on-Chip Designs", Mar. 4-8, 2002, Design, Automation and Test in Europe Conference and Exhibition (DATE'02), pp. 486-490.*

Vermaak et al., Enhanced P1500 Compliant Wrapper suitable for Delay Fault Testing of Embedded Cores, May 25-28, 2003, IEEE, pp. 121-126.*

Vermaak, H., J; et al "Using the Oscillation Test Method to Test for Delay Faults in Embedded Cores" Africon, 2004. 7TH Africon Conference in Africa Gaborone, Botswana. vol. 2, Sep. 15, 2004, pp. 1105-1110.

Waayers, Tom—Institute of Electrical and Electronics Engineers: "An Improved Test Control Architecture and Test Control Expansion for Core-Based System Chips" Proceedings International Test Conference 2003. (ITC). vol. 1, Sep. 30, 2003, pp. 1145-1154.

Benabdenbi, M; et al "Testing Taped Cores and Wrapped Cores With the Same Test Access Mechanism" Design, Automation and Test in Europe, 2001. Conference and Exhibition 2001. Proceedings. Mar. 13, 2001, pp. 150-155.

Marinissen, E., J; et al "Infrastructure for Modular SOC Testing" Custom Integrated Circuits Conference, 2004. Proceedings of the IEEE 2004. Oct. 3, 2004, pp. 671-678.

Vermeulen, B; et al "IEEE 1149.1-Compliant Access Architecture for Multiple Core Debug on Digital System Chips" Proceedings International Test Conference 2002. ITC 2002. Oct. 7, 2002, pp. 55-63.

* cited by examiner

IC TESTING METHODS AND APPARATUS

The present invention generally relates to testing of semiconductor integrated circuits, and in particular relates to a core test method and apparatus.

One common testing technique for the testing of semiconductor integrated circuits (ICs) is a scan testing technique. This essentially involves launching a test pattern (termed "vector") into the pins of a device package and monitoring an output response at a specific time, dependent on the clock speed of the device. A set of test vectors is used to enable the behaviour of the device under test to be determined. These vectors are designed to enable detection of manufacturing defects in the device.

As the number of transistors used in integrated circuits grows, the ability to reuse integrated circuit designs becomes increasingly important. One important issue concerning the reuse of design functions (termed "cores") is the ability to test these cores without re-engineering the testing methodology, so that test reuse can be implemented as well as design reuse. The testing of System on Chip (SoC) circuits with multiple functional cores also becomes an increasing challenge.

Primarily to address these issues, the IEEE P1500 working group was formed, and has developed a core level solution to facilitate test integration and test reuse. The standard has now been adopted as IEEE STD 1500 and provides a standard interface and a set of rules defining the boundary between a core and the logic external to the core. This boundary is termed a "wrapper", and allows the isolated test of a core with minimum signals that must be routed outside the system on chip structure. The wrapper comprises so-called "wrapper cells" for each functional input and functional output of the core.

Figure 1:
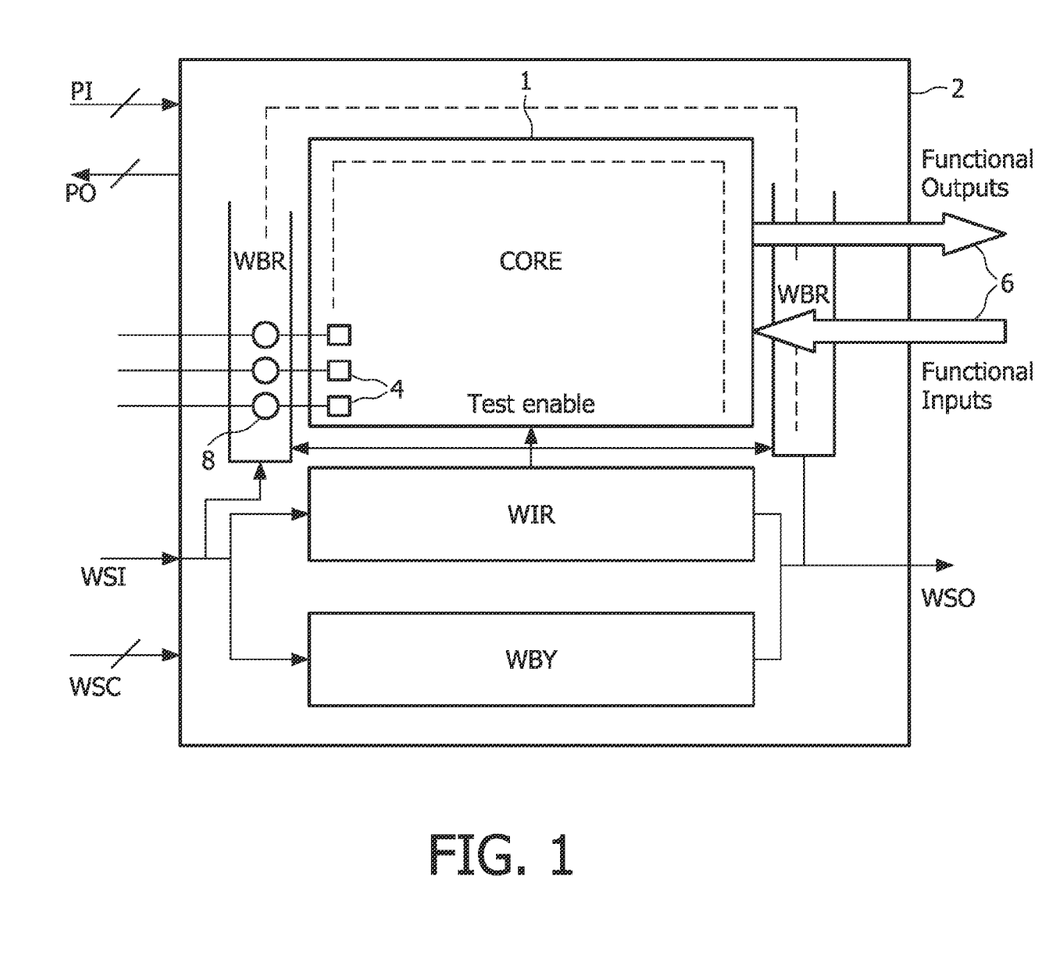
FIG. 1 shows a known testing circuit wrapper for an integrated circuit core.

FIG. 1 shows the basic layout of an IEEE STD 1500 wrapper. The core 1 is surrounded by the wrapper 2, which acts as an interface between all external signals and the core. The wrapper has a wrapper boundary register (WBR) between the core Functional Inputs (FI)/Outputs (FO) and the wrapper functional inputs/outputs. The core terminals are shown as 4, and some of these are functional inputs and some are functional outputs. The standard dictates that the core 1 is defined with unidirectional terminals. The arrows 6 show schematically that the Wrapper Boundary Register acts as the interface between the external functional inputs and outputs and the core functional inputs and outputs.

The Wrapper Boundary Register WBR comprises a chain of cells 8, each associated with an individual functional input or output of the core. These cells are configured into a scan chain to supply the desired test vectors for the control of the core functional inputs or to shift out the results present on the core functional outputs. The cells of the WBR thus essentially implement a scan test technique by providing a selected test vector to the functional inputs and outputs of the core.

The wrapper 2 has a Wrapper Serial Input (WSI) and a Wrapper Serial Output (WSO), and these communicate with an instruction register, termed Wrapper Instruction Register (WIR) and with the Wrapper Boundary Register (WBR).

The Wrapper Boundary Register WBR controls and observes the ports 4 of the functional core. The cells 8 of the WBR are configured in response to the instructions provided to the wrapper instruction register WIR, and the Wrapper Instruction Register essentially controls the testing process.

In particular, the WIR and WBR are configured to operate in response to control signals which indicate the commands "Select", "Capture", "Shift" and "Update".

A shift comprises the advance of the data in the WBR one storage position closer to the test output (and also the advance of data in the WIR or other register). Thus, the shift commands load the WBR cells with the desired test vector.

A capture comprises the storing of the data present on the functional inputs or outputs of the WBR into the WBR cells.

An update comprises storing of the data within the WBR cell shift storage element, using an additional update storage element.

A transfer comprises the movement of data to the WBR cell shift storage element.

Although not shown in FIG. 1, the wrapper receives signals in the form of a Wrapper Capture signal (CaptureWR), a Wrapper Shift signal (ShiftWR) and an Update Wrapper signal (UpdateWR). In addition, the wrapper is controlled by a Wrapper Clock Signal (WRCK), a Wrapper Reset Signal (WRSTN) signal and an Instruction Register Selection signal (SelectWIR).

The Wrapper Instruction Register (WIR) is used to configure the wrapper into a desired mode of operation, determined by the instructions shifted into the WIR. This instruction may be tens or hundreds of bits in length, and can define different test and diagnosis modes of operation. Additional circuitry of the WIR (not shown) is used to interpret the loaded WIR instruction and provide the appropriate control signals to the WBR which controls the interaction with the core.

The wrapper uses the same serial input for the loading of the serial test vectors to be shifted into the WBR cells as for the loading of instruction data, and the SelectWIR signal determines which mode of operation is in use.

The WIR thus decodes loaded instructions and then controls the Wrapper Boundary Register WBR to implement the specified control. The WIR circuitry receives the signals CaptureWR, ShiftWR, UpdateWR and the clock signal WRCK, a reset signal WRSTN signal and the signal SelectWIR, discussed above.

The Wrapper Instruction Register can also control a Wrapper Bypass Register (WBY), which is operable to pass a wrapper serial input (WSI) to the wrapper serial output (WSO) without any interaction with the core. This is in response to a WIR instruction. In addition, an external test can be controlled by the WIR to provide external controllability and observability of the core, and this test involves connecting the Wrapper Boundary Register WBR to the Wrapper Serial Input and Output (WSI and WSO). This enables the loading of customer specified data into the WBR cells.

The Wrapper Instruction Register receives its control input from a Wrapper Serial Control (WSC) input.

The terminals above are from the serial port. The wrapper can also have parallel ports, shown in FIG. 1 as a parallel input port PI and a parallel output port PO.

This invention relates in particular to the testing of the Wrapper Instruction Register. The WIR is typically implemented using so-called 'shift/shadow' registers. The basic structure of this type of register consists of a serial shift register and a parallel update register. One advantage for these two sequential layers is the ability to keep test mode conditions (the instruction data) in the parallel update register while loading a new set of test mode conditions (test vector) in the serial shift register. As the registers are integrated as part of the System on Chip device, these registers must also be tested.

According to the invention, there is provided a shift register circuit for storing instruction data for the testing of an integrated circuit core, the shift register circuit comprising a plurality of stages, each stage comprising:

a serial input and a serial output;

a parallel output comprising one terminal of a parallel output of the shift register circuit;

a first shift register storage element for storing a signal received from the serial input and providing it to the serial output in a scan chain mode of operation; and a second parallel register storage element for storing a signal from the first shift register storage element and providing it to the parallel output in an update mode of operation, wherein the stage further comprises a feedback path for providing an inverted version of the parallel output to the first shift register storage element in a test mode of operation.

This configuration enables testing of each shift register stage using the existing control lines. In particular, the inverted signal can be clocked to propagate through the shift register storage element and the parallel register storage element, and the eventual inversion of the output is monitored to indicate that the inverted signal has propagated through the circuitry.

The shift register circuit may comprise a Wrapper Instruction Register for an embedded core test architecture, for example a Wrapper Instruction Register for an IEEE STD 1500 embedded core test architecture.

Preferably, the first shift register storage element comprises a first flip flop (32), and the second parallel register storage element comprises a second flip flop (38).

Each stage preferable also comprises multiplexers controlled by a shift enable signal, an update enable signal and a test enable signal. This test enable signal can be implemented by the capture command of the IEEE STD 1500 wrapper architecture.

The stages are preferably connected together in a chain with the serial output of each stage other than the last stage connected to the serial input of the next stage.

The invention also provides an IEEE STD 1500 wrapper comprising a Wrapper Instruction Register of the invention, a Wrapper Boundary Register; and a Wrapper Bypass Register.

The invention also provides an integrated circuit comprising a circuit core and an IEEE STD 1500 wrapper of the invention.

The invention also provides a method of testing a shift register circuit for storing instruction data for the testing of an integrated circuit core, the shift register circuit comprising a plurality of stages, the method comprising:

resetting a parallel register storage element of each stage to provide a known output;

inverting the known output and coupling the inverted output to the input of a serial register storage element of each stage;

providing a serial output from the shift register, and monitoring the output for testing of the stages.

This provides a self test method for the shift register stages using inputs and control lines that are already required.

The method may further comprise re-inverting the output of the parallel register storage element and coupling the re-inverted output to the input of the serial register storage element of each stage. In this way, the serial register can be filled with 0s and 1s in turn.

The method enables the correct monitoring of the propagation of 1s and 0s through the stage, as well as monitoring the correct functioning of the serial scan chan. In this way, the correct serial scan chain operation can be monitored both for passing 1s and 0s. The method can also enable monitoring the correct functioning of the reset operation.

The method is preferably for testing the wrapper instruction register of a core test wrapper, for example an IEEE STD 1500 wrapper.

An example of the invention will now be described in detail with reference to the accompanying drawings, in which.

The invention provides an architecture which enables the shift registers to be tested. To make the instruction register testable, it has been recognised by the applicant that one possibility is to feed the update register outputs back into the shift register. Testing of the register, including the asynchronous reset of the update register, could then use multiple patterns that are sequentially shifted in and out of the register structure.

The invention provides a specific implementation of such a feedback path to enable a simple test sequence to be used for the instruction register. This enables the structure to be controlled via a state machine protocol.

Before describing the invention in further detail, a more detailed outline of the wrapper structure and operation will be given.

Figure 2:
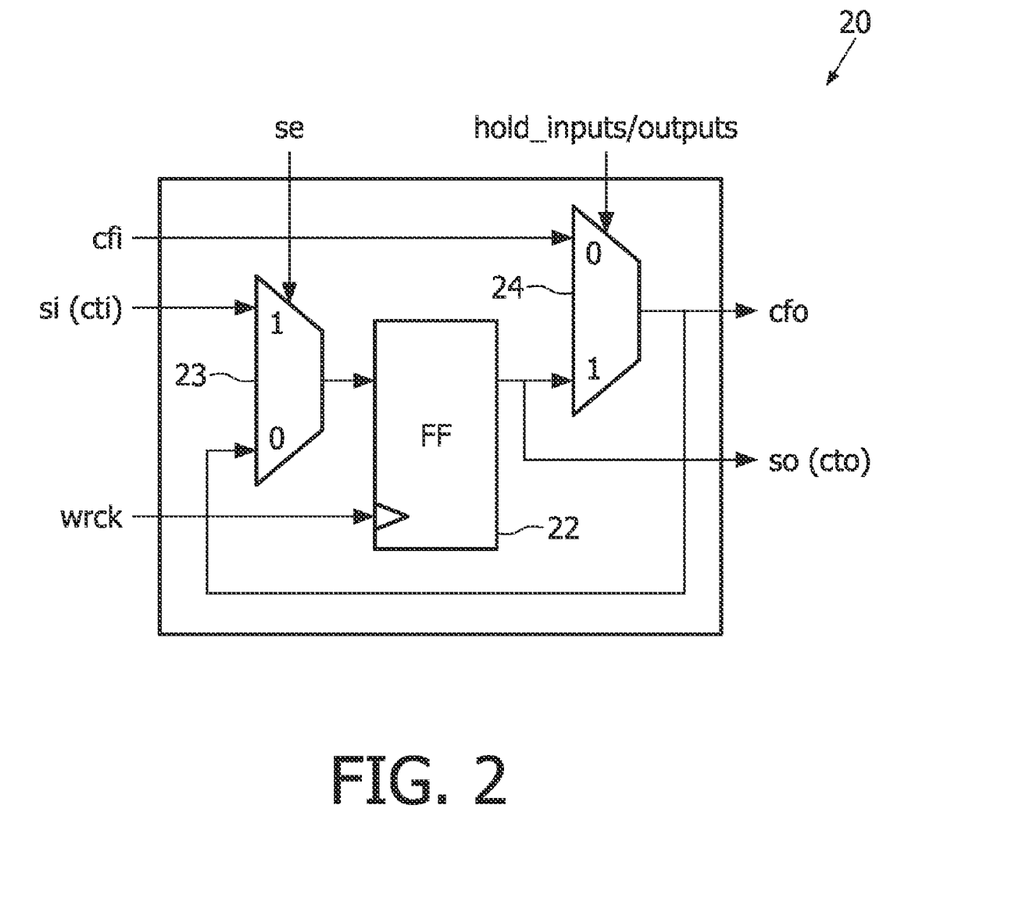
FIG. 2 shows one wrapper boundary cell of the circuit of FIG. 1 in more detail.

As mentioned above, the Wrapper Boundary Register is formed as a plurality of cells, and FIG. 2 shows an example of one such cell 20, corresponding to one of the cells 8 shown in FIG. 1.

This cell can be configured as an input cell or as an output cell. For an input cell, the hold_inputs/outputs signal is "hold_inputs" and for an output cell, the hold_inputs/outputs signal is "hold_outputs".

These hold signals control the WBR cells, and these hold signals are static, to select between core internal (inward facing) and core interconnect (outward facing) tests. The hold signals are generated in response to the interpretation of the WIR instruction, and are controlled in dependence on the selected test (or diagnostic or application) mode. The application mode essentially comprises the disabling of the wrapper to allow normal functionality of the core.

The cell 20 receives a serial input "si", which is the cell test input "cti". This serial input is clocked to the serial output "so", which is the cell test output "cto" by the flip flop 22 when a shift enable control line "se" is high. This shift enable control signal controls a multiplexer 23. The shift enable control line thus controls shifting of signals along the scan chain. Note that the shift enable control lines "se" are related to the command "shiftWR".

For an input cell, in order to provide a signal to the core, in response to a high hold signal at the control line "hold_inputs", the output of the flip flop 22 is provided to the cell functional output "cfo" through multiplexer 24. This is also fed back to the multiplexer 23, and with the shift enable line low, this signal is fed to the flip flop 22 to maintain the cell functional output stable. Thus, a cell test input signal stored in the flip flop is held on the cell test output. The input cell can also observe the environment external to the core, and route this to the serial output.

For an output cell, a signal can be received from the core at the cell function input, and with the hold_outputs signal low, this can be routed (with shift enable low) to the serial output. Similarly, a cell test input can be routed to the cell functional output.

It can be seen that an input cell can provide a test signal to the core, and an output cell can receive a response from the core, and can also provide an outward facing test signal to the circuitry outside the core. These functions are controlled by the hold signal values, which provide the control of the way the WBR operates.

Figure 3:
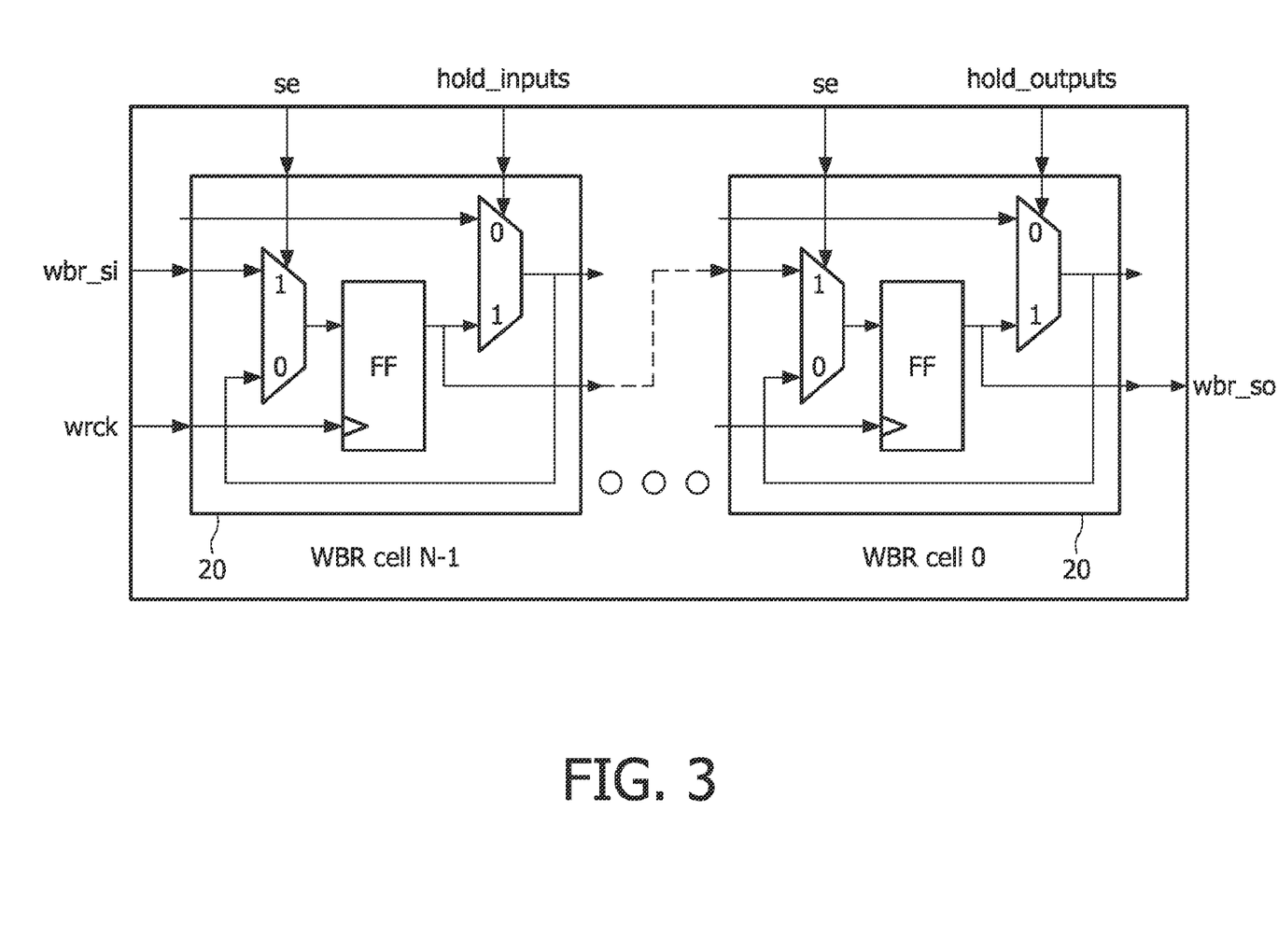
FIG. 3 shows the wrapper boundary register of the circuit of FIG. 1.

FIG. 3 shows multiple cells 20 of FIG. 2 connected in series to define the WBR, which is shown as formed from N cells (numbered 0 to N-1). Some of the cells are configured as input cells (for input terminals of the core) and others are configured as output cells (for output terminals of the core). FIG. 3 thus represents the full WBR shown in FIG. 1.

Figure 4:
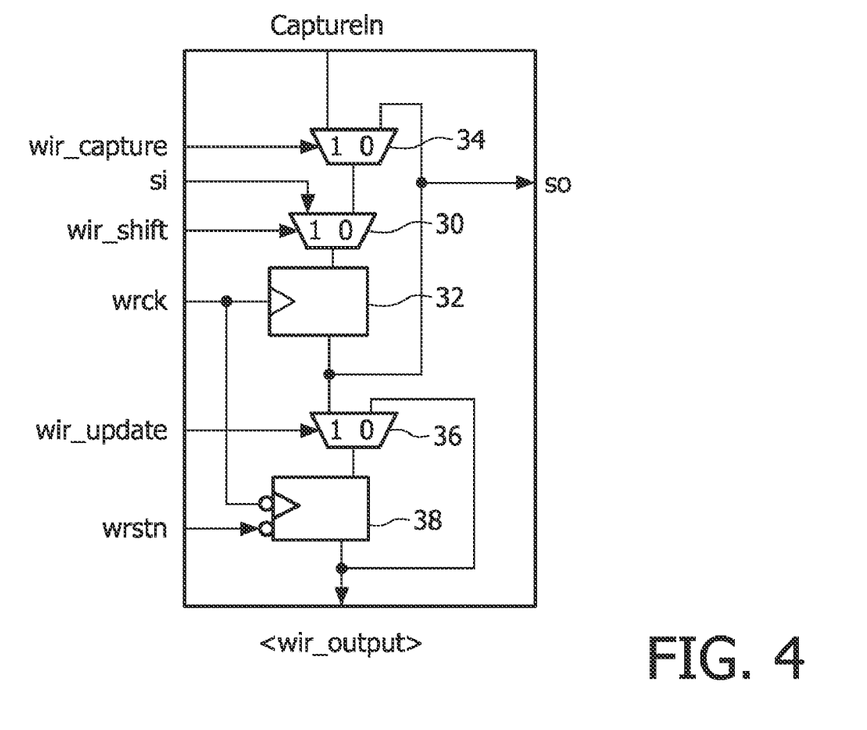
FIG. 4 shows one possible slice architecture for the wrapper instruction register of FIG. 1.

FIG. 4 shows one possible way to implement an instruction register block, forming a building block for the WIR.

FIG. 4 shows the wrapper instruction register "Capture", "Shift" and "Update" signals, as well as the clock "wrck" and reset "wrstn" signals.

The serial input "si" is supplied to the "1" input of a multiplexer 30 which is controlled by the shift signal. When the shift signal is high, this serial input is fed to a first flip flop 32, which clocks the input signal to the serial output "so". This provides a serial chain operation.

The output is also fed back to a second multiplexer 34 which implements the capture function. In the absence of a capture command, the output is fed to the "0" input of the multiplexer 30. This maintains the output stable until the next high shift signal, which replaces the input to the multiplexer 30 with the next serial input value.

The serial output is also provided to a third multiplexer 36, and this passes the output to a second flip flop 38 in response to a high update signal. After an update signal, the output of the flip flop 38 is stable, as the output is fed back to the "0" input of the multiplexer 36. Thus, after the update action, the output of the flip flop 38 is stable and stores the value in the flip flop 32. This defines the wrapper instruction register (WIR) output.

The multiplexer 34 for implementing the capture command enables an external signal CaptureIn to be loaded into the flip flop 32. This signal may come from the core, and can be used for providing diagnosis information or status information (for example the state of an internal BIST engine) to the output, and thus provide external access to these sources of information.

The reset signal resets the WIR output, and the application mode is also implemented (effectively disabling the wrapper) during the reset mode of operation.

It can be seen that the functionality of the circuit shown in FIG. 4 can be selected to:
shift a serial input to the serial output using the shift signal, and through the flip flop 32;
load an "external" signal into the flip flop 32, which can in turn be routed to the flip flop 38 or to the serial output;

In FIG. 4, the flip flop 32 forms part of a serial instruction register, and the flip flop 38 forms part of a parallel update register. Data can be loaded into the update register in parallel and independently of the serial operation. Thus, test mode conditions can be stored in the parallel update register, while a new set of test mode conditions (i.e. an instruction) is loaded into the serial shift register.

Figure 5:
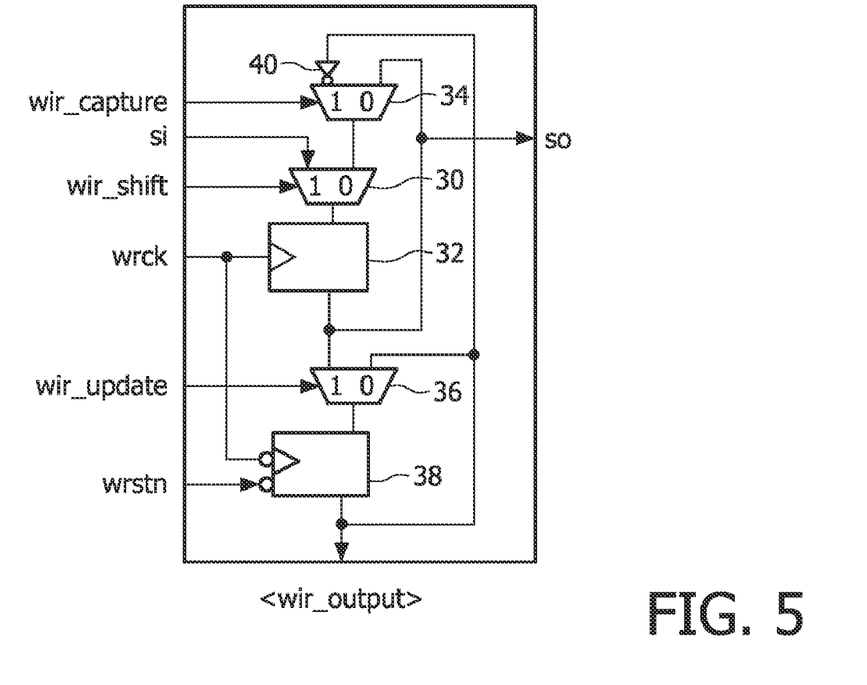
FIG. 5 shows a slice architecture of the invention for the wrapper instruction register of FIG. 1.

FIG. 5 shows an implementation of the WIR basic slice structure of the invention. The components are the same as in FIG. 4, but the WIR output is also fed back to the "1" input of the multiplexer 34, through an inverter 40.

This circuit uses the capture signal as an internal test control. When the capture signal goes high, the inverse of the WIR output is supplied to the multiplexer 30, and this in turn is supplied to the flip flop 32 when there is no shift signal input. This inverted WIR output thus can be controlled to propagate through the structure to the WIR output using the update control signal. The circuit of FIG. 4 is thus modified by providing an inverter in a feedback path between the parallel update register storage element and the serial update register storage element.

Figure 6:
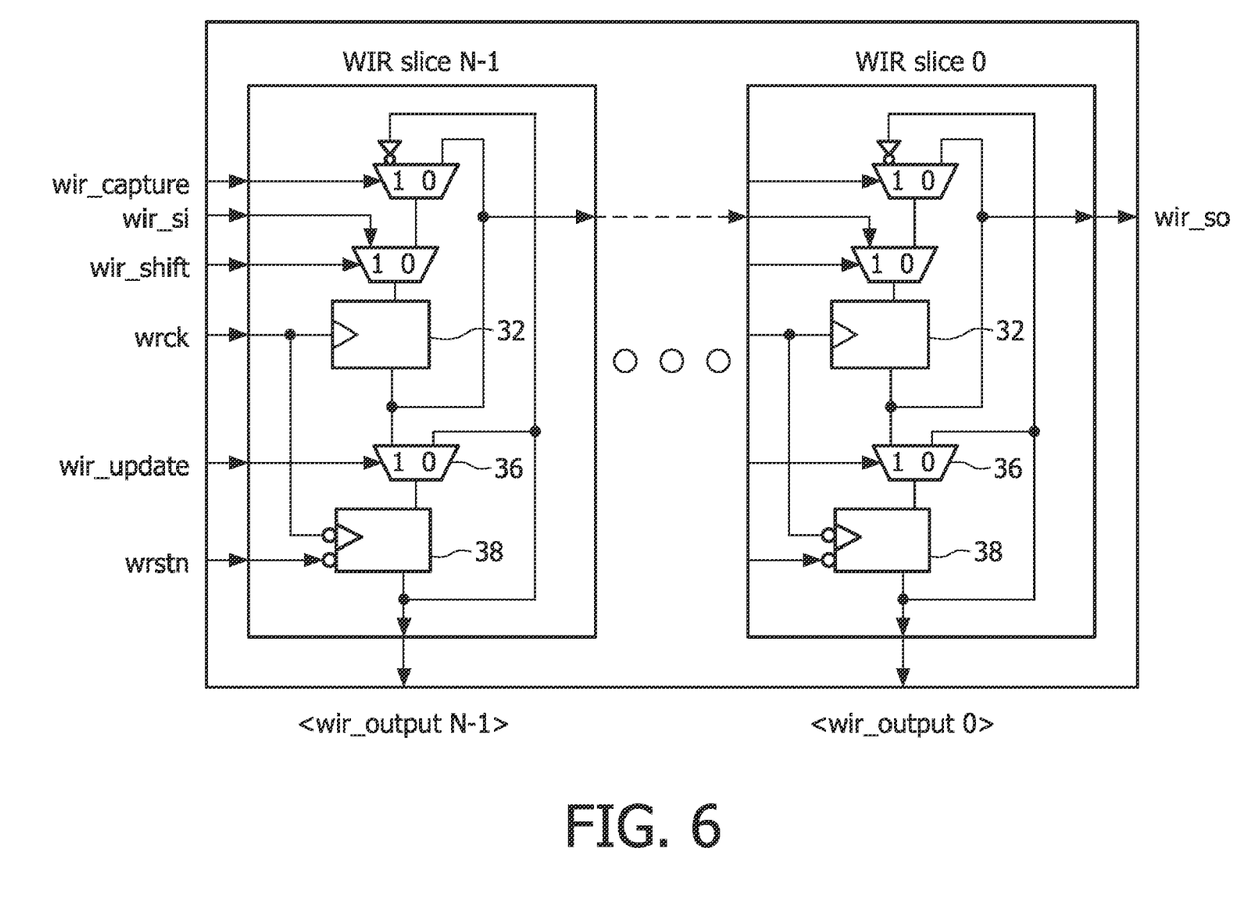
FIG. 6 shows the wrapper instruction register of the invention.

FIG. 5 shows one building block for forming the Wrapper Instruction Register, and FIG. 6 shows the Wrapper Instruction Register formed using the building block of FIG. 5.

As shown, the WIR comprises a series chain of the elements of FIG. 5, with the serial output of one connected to the serial input of the next. All units share the same clock, capture, shift, update and reset signals.

This register provides the conventional serial loading of data using the WIR serial input ("si") port and the parallel provision of the WIR output, which can comprise a test vector to be applied to the core under test.

However, the architecture also allows testing of the instruction register, and this can be implemented using the following test procedure:

1. Reset

This involves providing the appropriate reset signal to wrstn (for example wrstn=0). The effect of this is to store the value 0 in all flip flops 38 forming the update register. The flip flops 32 of the serial register will not be changed, and will store any previous values.

2. Hold

The reset signal is ended (so that wrstn=1) and the WIR input control signals (capture, shift, update) are zero. The outputs keep value 0 by the feedback path through multiplexer 36.

3. Capture

The capture signal is brought high (wir_capture=1), and this provides the loading of the inverse signals into the flip flops 32, through the multiplexer 30 (with wir_shift=0). The serial register stores all 1s and the parallel update register stores all 0s.

4. Hold

The WIR input control signals (capture, shift, update) are zero.

5. Update

By raising the update signal to 1 (wir-update=1), the 1 s stored in the flip flops 32 are loaded into the flip flops 38.

6. Hold

The WIR input control signals (capture, shift, update) are zero.

7. Capture

The capture signal is again brought high (wir_capture=1), and this provides the loading of the inverse signals into the flip flops 32, through the multiplexer 30 (with wir_shift=0). The serial register now stores all 0s and the parallel update register stores all 1s.

8. Hold

The WIR input control signals (capture, shift, update) are zero.

9. Shift response

During this cycle, the serial shift register values (all 0) are shifted along the scan chain using wir_shift=1. The output from the serial chain at wir_so is monitored to make sure the expected chain of zeros is received.

10. Reset

Setting wrstn=0 implements a reset, again updating the parallel update register with values 0, and any value can be stored in the serial shift register. This reset operation also checks that the flip flops 38 are all able to switch, as they all toggle from the known state 1 to the new state 0.

11. Hold

The WIR input control signals (capture, shift, update) are zero after the reset signal is ended (wrstn=1).

12. Capture

The final capture signal (wir_capture=1) updates the serial shift register with values 1, and the parallel update register stores all 0s.

13. Shift response

During this cycle, the serial shift register values (all 1) are shifted along the scan chain using wir_shift=1 and the output from the serial chain at wir_so is monitored to make sure the expected chain of ones is received.

During the hold phases, the flip flops will hold their data values if they are functioning correctly.

It can be seen that the above series of steps provides testing of:
- the propagation of 0s through the serial flip flops through the capture and shift multiplexers.
- the propagation of 1s though the serial flip flops through the capture and shift multiplexers.
- the propagation of 0s through the update flip flops through the update mutiplexers.
- the propagation of 1s through the update flip flops through the update mutiplexers.
- the propagation of 0s through the series scan chain connections between slices.
- the propagation of 1s through the series scan chain connections between slices.
- the correct asynchronous reset of the update stages, which effectively acts as a test of the application mode.

The testing uses the two serial output sequences, looking for the expected chain of 1s and 0s to test the circuit, in particular the functional aspects listed above.

The invention has been described with reference to the IEEE STD 1500 wrapper architecture. However, the invention is applicable more generally to instruction registers which have a serial shift register function and a parallel update register function, and provides a feedback path between the storage elements for these functions to provide testability using low additional resources.

Various other modifications will be apparent to those skilled in the art.

The invention claimed is:

1. A shift register circuit for storing instruction data for the testing of an integrated circuit core, the shift register circuit comprising a plurality of stages, each stage of the plurality of stages comprising:
    a serial input and a serial output;
    a parallel output comprising one terminal of a parallel output of the shift register circuit;
    a first shift register storage element for storing a signal received from the serial input and providing the signal received from the serial input to the serial output;
    a second parallel register storage element for storing the signal to the serial output and providing the signal to the serial output to the parallel output; and
    a feedback path for providing an inverted version of the parallel output to the first shift register storage element,
    wherein:
    the first shift register storage element comprises a first flip flop;
    the second parallel register storage element comprises a second flip flop.

2. The shift register circuit as claimed in claim 1, wherein the shift register circuit further comprises a Wrapper Instruction Register for an embedded core test architecture.

3. The shift register circuit as claimed in claim 2, wherein the shift register circuit further comprises a Wrapper Instruction Register for an IEEE STD 1500 embedded core test architecture.

4. The shift register circuit as claimed in claim 1, wherein the serial input is provided to the first flip flop through a first multiplexer which is controlled by a shift enable signal.

5. The shift register circuit as claimed in claim 4, wherein the signal to the serial output is provided to the second flip flop through a second multiplexer which is controlled by an update enable signal, and which has the serial output as a first input and the feedback path from the parallel output as a second input.

6. The shift register circuit as claimed in claim 5, wherein the signal to the serial output is provided to a third multiplexer which is controlled by a test enable signal, and which has the serial output as a first input and the inverted version of the parallel output as a second input.

7. The shift register circuit as claimed in claim 6, wherein the output of the third multiplexer provides a first input of the first multiplexer, the serial input providing a second input of the first multiplexer.

8. The shift register circuit as claimed in claim 1, wherein the stages are connected together in a chain with the serial output of each stage other than the last stage connected to the serial input of the next stage.

9. The shift register circuit as claimed in claim 1, wherein the stages each share a shift enable, test enable and update enable control signal.

10. An IEEE STD 1500 wrapper comprising:
    a Wrapper Instruction Register (comprising the shift register circuit as claimed in claim 1;
    a Wrapper Boundary Register; and
    a Wrapper Bypass Register.

11. An integrated circuit comprising the integrated circuit core and the IEEE STD 1500 wrapper as claimed in claim 10.

12. A method of testing a shift register circuit for storing instruction data for the testing of an integrated circuit core, the shift register circuit comprising a plurality of stages, the method comprising:
    resetting a parallel register storage element of each stage to provide a known output;
    inverting the known output and coupling the inverted known output to the input of a serial register storage element of each stage;
    providing a serial output from the shift register;
    monitoring the output for testing of the stages;
    performing an update function to transfer the content of the serial storage register storage element to the parallel register storage element; and
    inverting the output of the parallel register storage element for a second time,
    wherein performing the update function and inverting the output of the parallel register storage element for the second time are performed before providing the serial output.

13. The method as claimed in claim 12, further comprising performing a further update function to transfer the content of the serial storage register storage element to the parallel register storage element.

14. The method as claimed in claim 13, further comprising inverting for a third time the output of the parallel register storage element, and providing a further serial output from the shift register, and monitoring the output for testing of the stages.

15. The method as claimed in claim 12, for testing the wrapper instruction register of a core test wrapper.

* * * * *